United States Patent [19]

Lowrey et al.

[11] Patent Number: 5,126,290

[45] Date of Patent: Jun. 30, 1992

[54] METHOD OF MAKING MEMORY DEVICES UTILIZING ONE-SIDED OZONE TEOS SPACERS

[75] Inventors: Tyler A. Lowrey; Ruojia Lee, both of Boise, Id.

[73] Assignee: Micron Technology, Inc., Boise, Id.

[21] Appl. No.: 760,026

[22] Filed: Sep. 11, 1991

[51] Int. Cl.⁵ .................... H01L 21/02; H01L 21/70
[52] U.S. Cl. ................... 437/235; 437/238; 437/48; 437/52; 437/50; 437/228
[58] Field of Search ............... 437/52, 48, 238, 235, 437/50, 228

[56] References Cited

U.S. PATENT DOCUMENTS

| | | | |
|---|---|---|---|
| 4,876,220 | 10/1989 | Mohsen et al. | 437/52 |
| 4,981,810 | 1/1991 | Fazan et al. | 437/52 |
| 5,017,515 | 5/1991 | Gill | 437/52 |
| 5,053,351 | 10/1991 | Fazan et al. | 437/52 |
| 5,084,406 | 1/1992 | Rhodes et al. | 437/48 |

Primary Examiner—Brian E. Hearn
Assistant Examiner—Trung Dang
Attorney, Agent, or Firm—David J. Paul

[57] ABSTRACT

The present invention provides a programmable structure for a programmable read-only memory (PROM) which utilizes one-sided ozone spacers constructed on the digit lines as one time programmable nodes. An oxide/nitride/oxide layer (ONO) is used as an interface between underlying parallel rows of digit lines, having one-sided ozone spacers, and overlying parallel columns of word lines in a programmable read only memory. With a each digit line passing under each word line in a row/column matrix is formed thereby providing a programmable digit/word line matrix. Each crossing point of the digit and word lines in the matrix will be permanently programmed to either a one or a zero by rupturing the thin ONO dielectric interface by applying the appropriate voltage potential between the associated digit/word line conductors.

8 Claims, 3 Drawing Sheets

METHOD OF MAKING MEMORY DEVICES UTILIZING ONE-SIDED OZONE TEOS SPACERS

FIELD OF THE INVENTION

This invention relates to the field of semiconductor devices. More specifically, a process is described which allows one time programming of non-volatile memory devices by utilizing one-sided ozone spacers constructed on digit lines as programmable nodes.

BACKGROUND OF THE INVENTION

A read only memory (PROM) consists of an array of semiconductor devices (diodes, bipolar or field-effect transistors) which interconnect to store an array of binary data (ones or zeros). A ROM basically consists of a memory array of programmed data and a decoder to select the data located at a desired address in the memory array.

Three basic types of ROMs are mask-programmable ROMs, erasable programmable ROMs (EPROMs) and field-programmable ROMs (PROMs). The data array is permanently stored in a mask-programmable ROM, at the time of manufacture, by selectively including or omitting the switching elements at the row-column intersections in the memory array. This requires a special mask used during fabrication of the integrated circuit which is expensive and feasible only when a large quantity of the same data array is required.

EPROMs use a special charge-storage mechanism to enable or disable the switching elements in the memory array. In this case, appropriate voltage pulses to store electrical charges at the memory array locations is provided. The data stored in this manner is generally permanent until it is erased using ultraviolet light allowing it to once again be programmed.

PROMs (being the focus of the present invention) are typically manufactured with all switching elements present in the array, with the connection at each row-column intersection being made by means of a fusible link. In order to store data in the PROM, these fusible links are selectively blown using appropriate voltage pulses supplied by a PROM programmer. Once the links are blown, the data is permanently stored in the memory array.

SUMMARY OF THE INVENTION

The present invention creates a unique structure, available at each row-column intersection, that provides one time programming of the data memory array without using the conventional fusible link approach.

The structure of the present invention can be conveniently employed during the fabrication of an integrated circuit which may use one time programming. Specifically, the programmable structure utilizes one-sided ozone spacers constructed on the digit lines (or rows) as programmable nodes at each point of intersection of overlying word lines (or columns).

The present invention focuses on integrating the programmable structure specifically into a PROM but it will be obvious to one skilled in the art to implement this approach into other integrated circuits using one time programming, such as programmable logic arrays (PLAs), programmable array logic (PALs) and the like.

DETAILED DESCRIPTION OF THE PREFERRED EMBODIMENT

Figure 5:
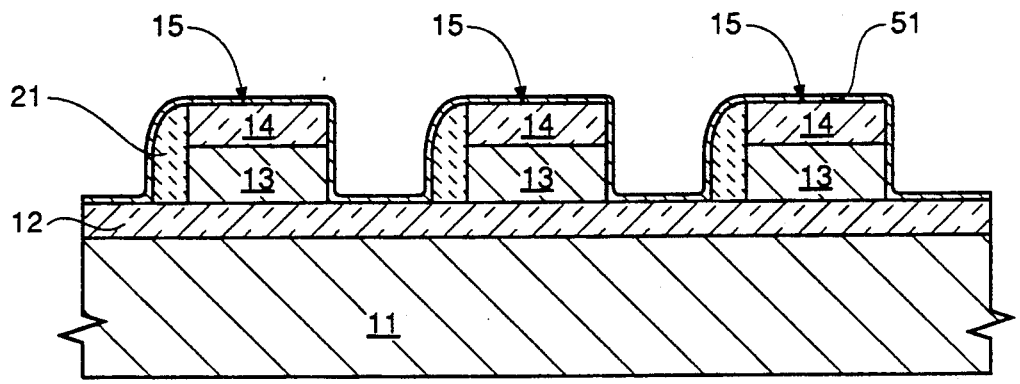
FIG. 5 shows a cross-sectional view of the inprocess wafer portion of FIG. 4 after deposition of antifuse dielectric.
Figure 6:
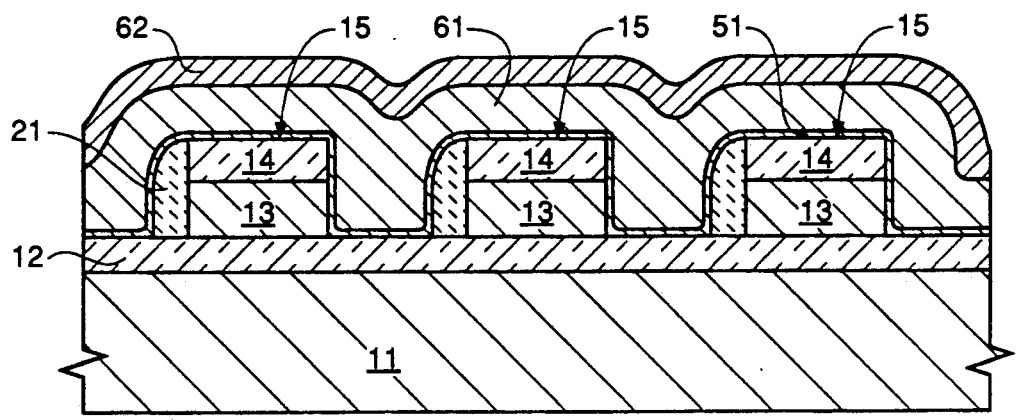
FIG. 6 shows a cross-sectional view of the inprocess wafer portion of FIG. 5 after depositions of polysilicon and silicide.

To manufacture the programmable structure of FIG. 6, a wafer is processed up to the point prior to fabricating the digit lines of a PROM memory array by using conventional process steps. The formation of the programmable digit/word line matrix is described in the steps illustrated in FIGS. 1-6.

Figure 1:
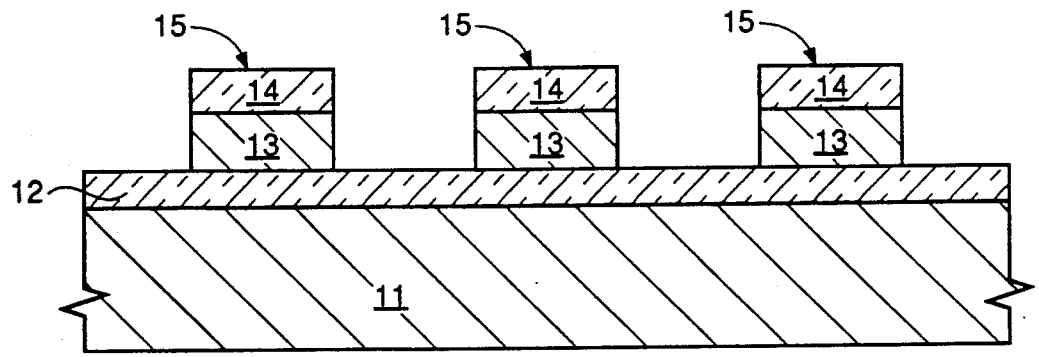
FIG. 1 shows a cross section of patterned parallel digit lines in a memory array of a PROM.

As shown in FIG. 1, silicon substrate 11 has been covered by a thick dielectric layer 12, such as oxide or nitride. Rows of parallel digit lines 15 are then patterned and etched out of layers of polysilicon 13 and oxide 14.

Figure 2:
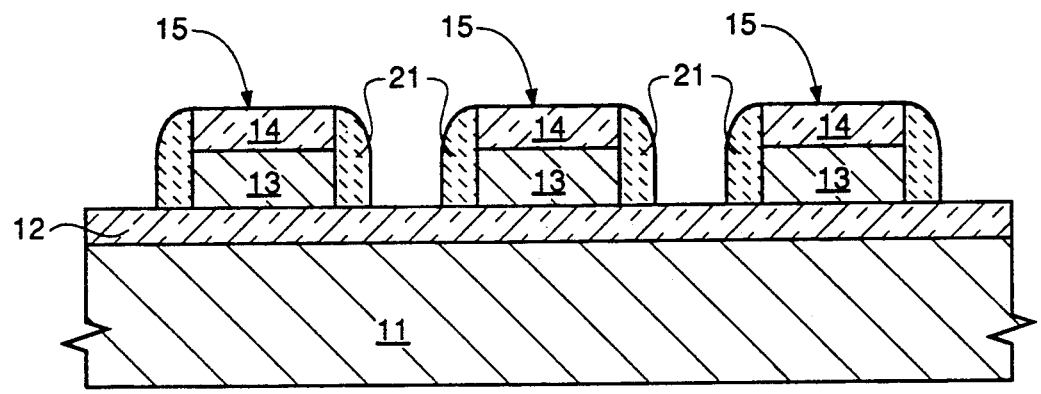
FIG. 2 shows a cross-sectional view of the inprocess wafer portion of FIG. 2 after formation of oxide spacers.

Referring now to FIG. 2, oxide spacers 21 are formed on both sides of digit lines 15. Although any oxide would serve as digit lines spacers, it is preferred to form spacers 21 out of ozone using a TEOS source gas due to the fast wet etch rate of $O_3$ TEOS.

Figure 3:
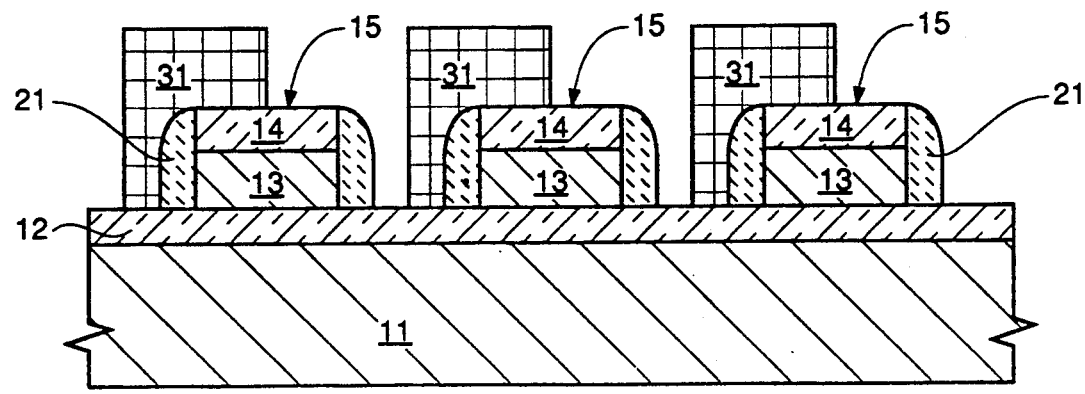
FIG. 3 shows a cross-sectional view of the inprocess wafer portion of FIG. 2 after placing photo resist to protect one side of each digit line's oxide spacer from a subsequent etch.

Referring now to FIG. 3, photoresist 31 is patterned to expose an oxide spacer 21 of each digit line 15 thereby exposing every other oxide spacer of parallel digit lines 15.

Figure 4:
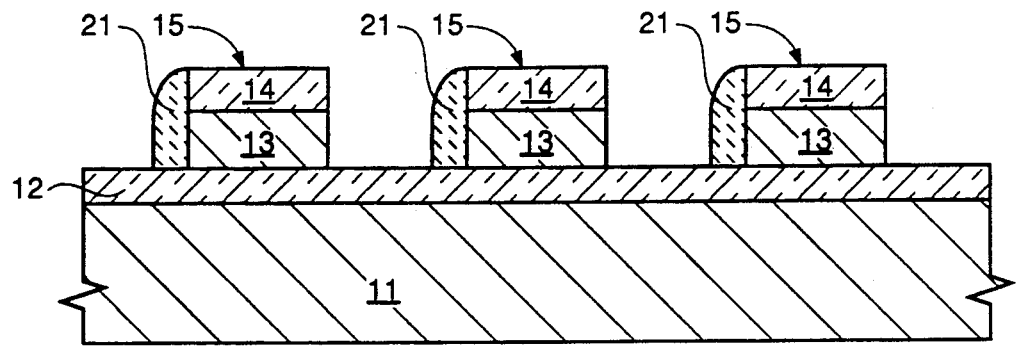
FIG. 4 shows a cross-sectional view of the inprocess wafer portion of FIG. 3 after an isotropic etch and photo resist strip.

Referring now to FIG. 4, an isotropic etch (e.g., wet oxide etch) is performed to remove each exposed oxide spacer 21 adjacent to one side of polysilicon 13. Photoresist 31 is then stripped to leave digit lines 15 with having one-sided oxide spacers.

Referring now to FIG. 5, a thin antifuse dielectric layer 51 is formed out of thermal oxidation and/or depositions of oxide, nitride and oxide respectively (otherwise known as ONO). Dielectric layer 51 becomes the important feature of the present invention to allow one time programming, which will be discussed later.

Referring now to FIG. 6, a conformal layer of doped polysilicon 61 is deposited superjacent dielectric 51 followed by a conformal deposition of silicide 62. Conventional fabrication continues from here on as polysilicon 61 and silicide 62 will be patterned and etched to form columns of parallel word lines 63.

The programmable digit/word line matrix is now complete with each digit line passing under each word line in a row/column matrix. Each crossing point of the digit and word lines in the matrix is associated with a specific memory address. Dielectric 51 becomes a thin dielectric interface between digit line polysilicon 13 and word line polysilicon 61. This thin dielectric interface allows for each intersection point between each row (digit line 15) and column (word line 63) to be permanently programmed to either a one or a zero. It is important to note that any two adjacent antifuse structures are separated by the normal digit line spacing, the next adjacent digit line spacer and the digit line itself. This spacing prevents the possibility of the depletion regions for two adjacent antifuse structures from touching each other and thereby avoid leakage from one structure to another. In addition, the vertical height of digit line polysilicon 13 becomes the controlling lithography resolution dimension, rather than the horizontal width of a conventional structure used to form a programmed pn diode.

Figure 7:
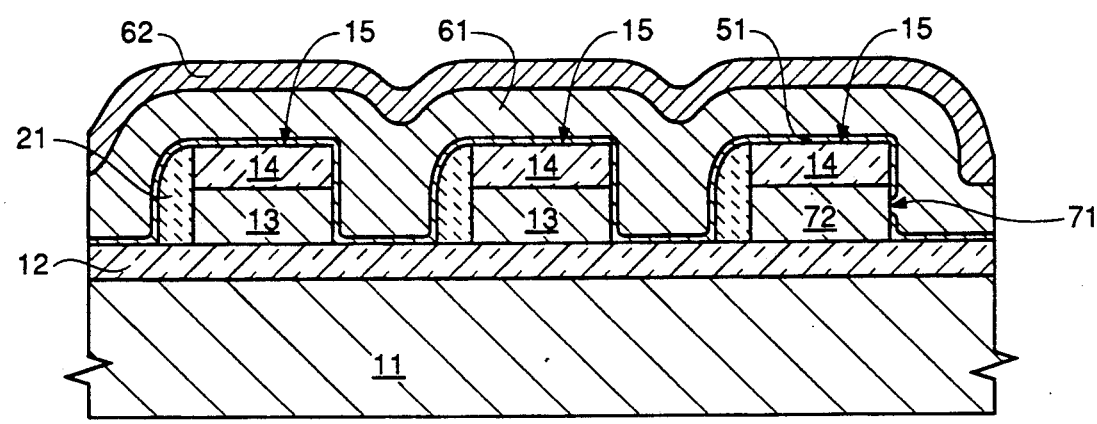
FIG. 7 shows a cross-sectional view of the present invention after the antifuse dielectric has been ruptured at a word/digit line intersection.

Programming the row/column matrix is performed in the same way conventional PROMs are programmed. As shown in FIG. 7, a one is desired to be programmed at a certain memory address location. To accomplish this, a positive voltage (usually 10-12V) is applied to the word line's ptype poly 61, while 0V is applied to the digit line's ntype poly 13 intersecting at the point of the desired memory address location (for sake of reference the digit line poly being programmed is referred to as digit line poly 72). This applied positive voltage forward biases the pn junction and is great enough to rupture the dielectric 51 interface. Once dielectric 51 ruptures, word line poly 61 and digit line poly 72 fuse together to form a pn diode 71 which becomes intercoupled between the digit/word line intersection. If a zero is desired at a certain memory address location, there is no difference of potential applied at that intersection or the pn junction is simply reversed biased, thus leaving the antifuse dielectric 51 interface intact. Once the row/column matrix is programmed, conventional sense amplifiers detect if current is present (a pn diode is present, thus a one is detected) or not (no pn diode present, thus a zero is detected).

It is to be understood that although the present invention has been described with reference to a preferred embodiment, various modifications known to those skilled in the art, such as reversing the conductivity type of the word and digit lines, may be made to the structures and process steps presented herein without departing from the invention as recited in the several claims appended hereto.

We claim:

1. A process to fabricate a one time programmable structure on a starting substrate of an integrated circuit comprising:
    a) forming an isolative dielectric layer superjacent said substrate;
    b) placing a first conductive material superjacent said isolative dielectric layer;
    c) forming a first dielectric layer superjacent said first conductive material;
    d) patterning said first conductive material and said first dielectric layer thereby forming first conductive lines spaced apart in parallel rows, said conductive lines having first and second sides;
    forming a second dielectric layer superjacent and coextensive said first conductive lines and exposed portions of said isolative dielectric layer;
    f) patterning said second dielectric layer thereby forming a thick dielectric spacer superjacent said first side of each said first conductive lines;
    g) forming a third dielectric layer blanketing said thick dielectric spacer, said second side of said first conductive lines and said first dielectric;
    h) placing a second conductive material superjacent said third dielectric layer; and
    i) patterning second conductive material thereby forming second conductive lines spaced apart in parallel columns, said parallel columns overlying said first conductive lines in an intersecting angular fashion.

2. The process of claim 1 wherein said substrate comprises silicon.

3. The process of claim 1 wherein said isolative dielectric, said first dielectric and said third dielectric layers comprise oxide.

4. The process of claim 7 wherein said third dielectric layer comprises ozone.

5. The process of claim 1 wherein said third dielectric layer comprises ozone formed form a TEOS source gas.

6. The process of claim 1 wherein said second dielectric layer comprises oxide/nitride/oxide.

7. The process of claim 1 wherein said first and said second conductive materials comprise doped polysilicon.

8. The process of claim 7 wherein the vertical width of said first conductor is the limiting lithography resolution dimension of said process.

* * * * *